United States Patent [19]

Dobos

[11] Patent Number: 4,851,789
[45] Date of Patent: Jul. 25, 1989

[54] PHASE TRIGGERABLE OSCILLATOR WITH TEMPERATURE COMPENSATION

[75] Inventor: Laszlo J. Dobos, Beaverton, Oreg.
[73] Assignee: Tektronix, Inc., Beaverton, Oreg.
[21] Appl. No.: 186,999
[22] Filed: Apr. 27, 1988
[51] Int. Cl.[4] .......................... H03B 5/04; H03L 1/02
[52] U.S. Cl. ................................. 331/108 B; 331/135; 331/173; 331/176
[58] Field of Search ................... 331/108 B, 135, 173, 331/176, 172

[56] References Cited

U.S. PATENT DOCUMENTS 3,889,205 6/1975 Mitchell ......................... 331/176 X
4,468,637 8/1984 Wray et al. ..................... 331/172 X
4,562,412 12/1985 Sugawara et al. ............... 331/173 X Primary Examiner—Siegfried H. Grimm
Attorney, Agent, or Firm—Mark L. Becker; Peter J. Meza

[57] ABSTRACT

A voltage controlled oscillator with temperature compensation and reduced trigger jitter. The temperature compensation is improved by applying an on-chip generated temperature-dependent control voltage to first and second parallel oscillator stages through which the oscillation signal passes. The second stage has a greater signal propagation delay than the first stage. The control voltage determines the signal delay contributed by each stage to the oscillating signal, decreasing the delay in response to a temperature-induced decrease in oscillator frequency and increasing the delay in response to a temperature-induced increase in frequency. The oscillator also includes means for generating oscillations from a predetermined signal phase that is independent of the oscillator phase before triggering.

8 Claims, 3 Drawing Sheets

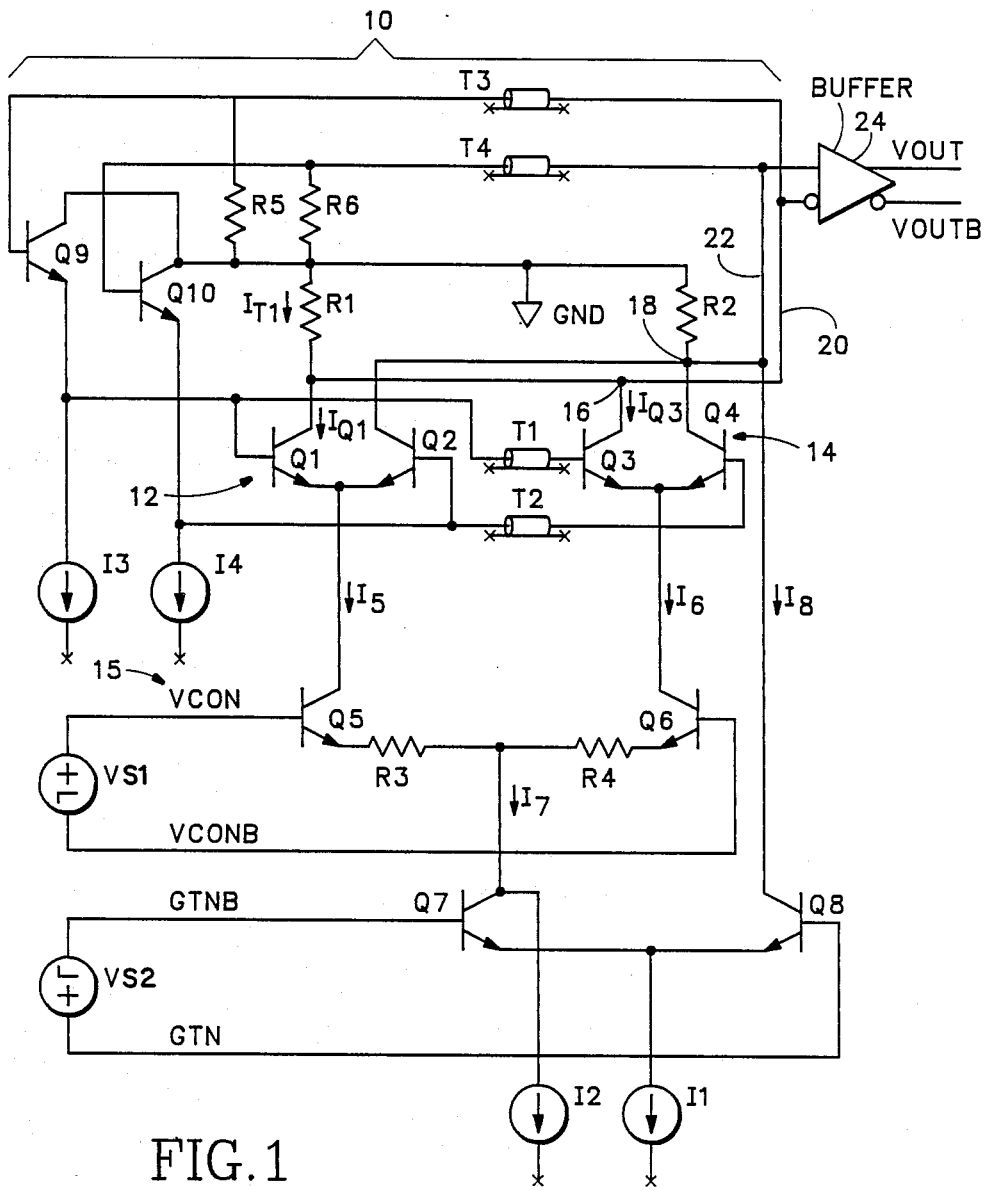
FIG.1
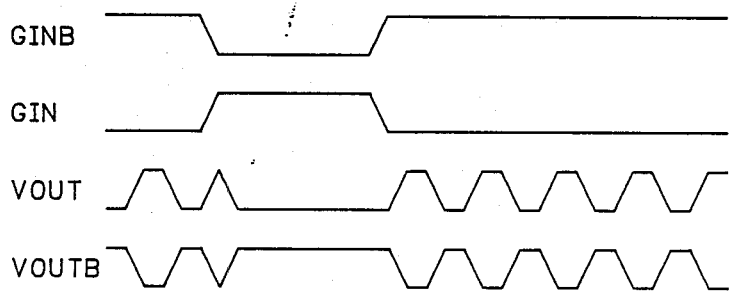

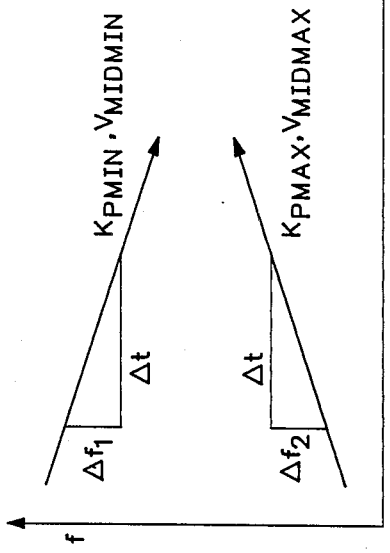
FIG. 5a
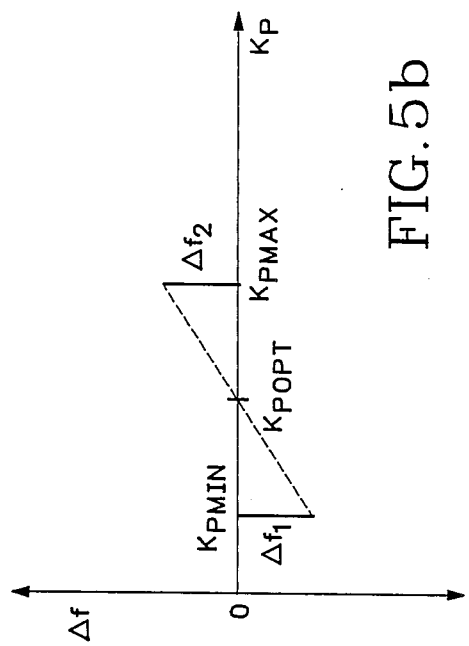
FIG. 5b
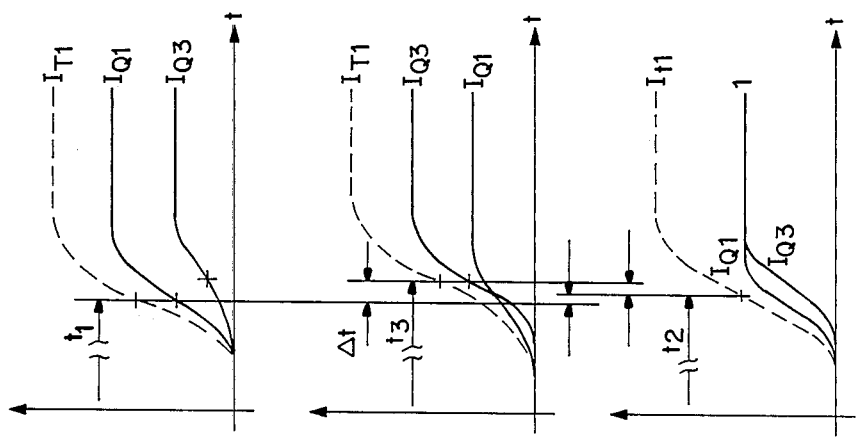
FIG. 2B
FIG. 2C
FIG. 2A

PHASE TRIGGERABLE OSCILLATOR WITH TEMPERATURE COMPENSATION

BACKGROUND OF THE INVENTION

This invention relates generally to oscillators and, more particularly, to a temperature compensated triggerable oscillator whose phase upon triggering is predetermined and independent of its phase before triggering.

Oscillators are found in most instrumentation, from simple clocks to complex signal generators and oscilloscopes. Generally, an oscillator is utilized to produce a stable, periodic time-varying output waveform which serves as the information or timing signal for signal processing circuits. In a digital oscilloscope, for example, an oscillating signal is utilized for taking samples of an input signal. It is desirable, therefore, that the oscillating signal be as stable as possible and maintain a frequency and period that are constant as the environment of the instrument changes.

One condition that seriously affects the stability of an oscillator is temperature. As temperature of a transistor-based oscillator increases during the gradual warming of an instrument, the transistor parameters within the oscillator change and cause the oscillator frequency to drift. Depending on the type of oscillator, the nominal frequency may increase or decrease in the face of increasing temperature. Prior attempts to correct for temperature drift have focused on either (1) making currents within the oscillator proportional to base-emitter junction voltages or (2) modifying the basic circuit configuration to eliminate the dependence of frequency on base-emitter junction voltages. Neither approach has proven to be entirely satisfactory. The first approach usually provides only a partial compensation; the second approach results in increased circuit complexity and requires the use of pnp transistors, which limit the high frequency capability of the oscillator.

It is also desirable that an oscillator utilized for measurement start from the same phase each time the oscillator is triggered. For example, the trigger jitter around signal points to be repetitively sampled can be minimized if the oscillator always starts its measurement from the same phase. Prior oscillators suffer from the drawback that the oscillator phase upon triggering is often a function of the oscillator phase before triggering.

SUMMARY OF THE INVENTION

An object of the invention, therefore, is to provide an oscillator that maintains a substantially constant frequency as the temperature of the oscillator changes.

Another object of the invention is to provide such an oscillator that compensates for temperature effects by varying the signal delay contributed to the oscillating signal by the oscillator stages.

Still another object of the invention is to provide a triggerable oscillator whose restart phase upon triggering is independent of the phase before triggering.

Yet another object of the invention is to provide such a triggerable oscillator whose restart phase is predetermined.

The foregoing and other objects, features, and advantages of the invention will become more apparent from the following detailed description of a preferred embodiment which proceeds with reference to the accompanying drawings.

BRIEF DESCRIPTION OF THE DRAWINGS

FIG. 1 is a schematic diagram of an oscillator according to the invention.

FIGS. 2A–2C are plots showing the range in signal propagation delay contributed by the stages of the oscillator.

FIGS. 5A and 5B are plots that illustrate how the optimal values of these factors are calculated by the microprocessor.

DETAILED DESCRIPTION

Figure 3:
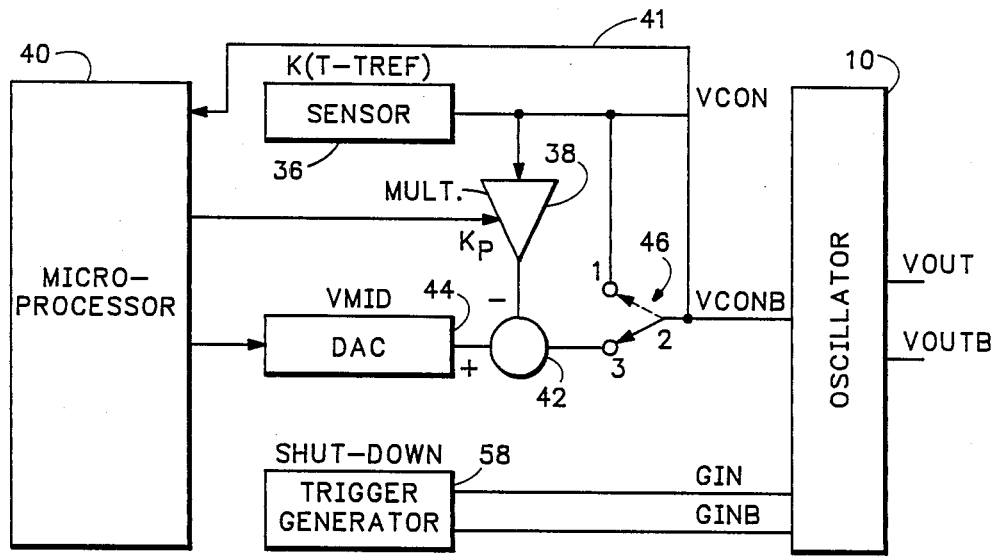
FIG. 3 is a block diagram of a circuit for providing the desired temperature compensation to the oscillator.

Referring now to the drawings, FIG. 1 is a schematic diagram of an oscillator 10 according to the invention. In the present embodiment the oscillator 10 generates a differential type output signal comprising VOUT and VOUTB, which signal type is often used in instrumentation. Within the oscillator 10 is a first differential stage 12 and a second, parallel differential stage 14 that includes delay elements T1 and T2 for providing a greater signal propagation delay through the second stage than the first. Each stage 12, 14 produces an inversion of the differential signal applied to the stage's input, with repeated inversions producing an oscillation. Each stage 12, 14 provides current gain to the signal in an amount determined by a third stage 15 comprising transistors Q5 and Q6, as will be described. The relative signal gains of the stages 12 and 14 determine the signal delay contributed by each stage to the total delay of the oscillating signal. The signal outputs of stages 12 and 14 are combined at nodes 16 and 18 to produce the oscillating signal, with the oscillation period therefore determined by the signal delay contributed by each stage 12, 14. The oscillating signal is then fed back along paths 20 and 22 through passive delay elements T3 and T4 and shifted downward in voltage by transistors Q9 and Q10 before being applied again to the inputs to stages 12 and 14. The differential output signals VOUT AND VOUTB are taken from paths 22 and 20 through means such as an isolation buffer 24.

Looking at the circuit elements in more detail, the first stage 12 is an active circuit element such as a differential amplifier comprising a pair of emitter-coupled transistors Q1 and Q2. Similarly, the second stage 14 includes a differential amplifier comprising a pair of emitter-coupled transistors Q3 and Q4 and the passive delay elements T1 and T2. These delay elements each comprise a low-pass filter or other passive means for delaying a signal's propagation. The delayed signal VOUTB is applied to the bases of Q1 and Q3, inverted by the transistors and taken from the collectors of Q1 and Q3. Similarly, VOUT is applied to the bases of Q2 and Q4, inverted by the transistors and taken from the collectors of Q2 and Q4. Gain for each of transistors Q1–Q4 is partially a function of equal-valued resistors R1, R2 and R5, R6 connected between the transistors' collectors and the feedback paths 20 and 22. VOUTB, as it is taken off the collectors of transistors Q1 and Q3, must be level shifted before being applied to the bases of transistors Q1 and Q3. This level shifting is effected by transistor Q9, with the oscillating signal being applied to the transistor base and being taken from the emitter a diode drop lower in voltage. Similarly, transistor Q10 shifts the level of VOUT before it is applied to the bases of transistors Q2 and Q4. Transistors Q9 and Q10 are maintained in their active region by constant bias currents I3 and I4. The delay elements T3 and T4 comprise in the present embodiment conventional coupled microstrip lines having a predetermined propagation delay. These elements T3 and T4 are passive in nature and their delay is relatively independent of temperature. The delay provided by these elements comprises a majority of the total delay through the oscillator 10. The difference in delay provided by the differential stages 12 and 14 need only be large enough to compensate for temperature-induced drift in the oscillator, as will be explained.

The signal gain of each differential stage 12 and 14 is determined by delay changing means such as the third stage 15. Stage 15 changes the current supplied to each stage 12, 14 to maintain a substantially constant period of signal oscillation in response to a temperature change in the oscillator. This third stage 15 comprises an emitter-coupled pair of transistors Q5 and Q6 whose DC collector currents are the bias currents for stages 12 and 14 repectively and therefore control the magnitude of the output voltages produced by stages 12 and 14 at resistors R1 and R2. These currents, referred to as I5 and I6 in the figure, sum to a constant total current 17. The magnitudes of I5 and I6 are varied by a voltage source labeled VS1 in the drawing which provides a pair of control voltages VCON and VCONB applied respectively to the bases of transistors Q5 and Q6.

FIGS. 2A–2C illustrate how the relative magnitudes of I5 and I6 determine the signal delay contributed by each of the stages 12 and 14 to the total propagation delay. In FIG. 2A, the control voltages VCON and VCONB are equal and thus the magnitudes of collector currents IQ1 and IQ3, which are proportional to I5 and I6 repectively, are equal. The current IT1 is the sum of these two currents, and its increase determines the increase in voltage across R1, which lowers VOUT. The propagation delay $t_2$ for IT1 to reach a level defining an inversion of VOUT is an average of the signal delays contributed equally by the two stages. In FIG. 2B, the propagation delay is at its minimum. VCON is greater than VCONB and the magnitude of IQ1 exceeds IQ3. The propagation delay $t_1$ is shorter than $t_2$ because the average of the delays is weighted more heavily toward stage 12. In FIG. 2C, the propagation delay is at its maximum. VCONB is greater than VCON, and therefore the magnitude of IQ3 exceeds IQ1. The propagation delay $t_3$ is greater than $t_2$ because the average of the delays is weighted more heavily toward stage 14. It can be seen, then, that by varying the relative magnitude of VCON and VCONB, the period of signal oscillation can be corrected to compensate for temperature-induced changes in the oscillator frequency.

Figure 4:
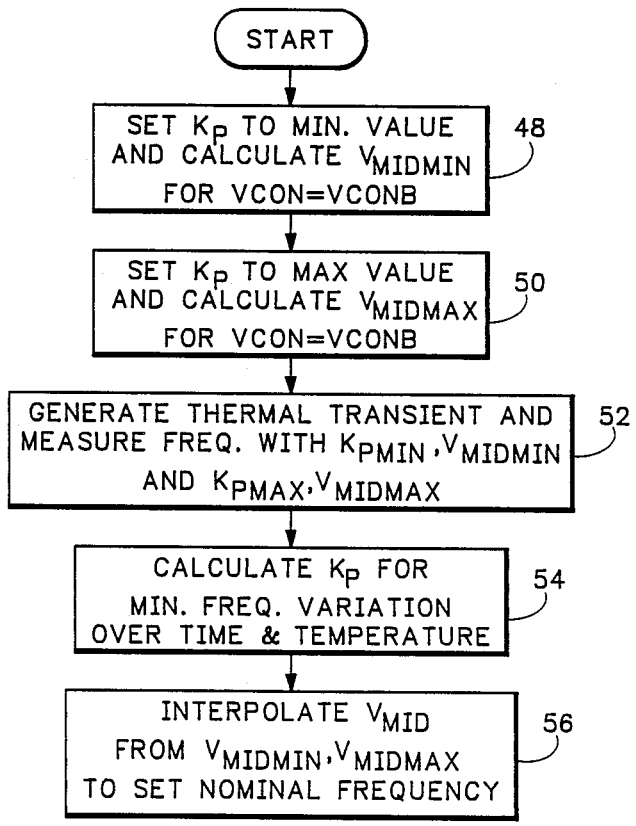
FIG. 4 is a flowchart of microprocessor operation for calculating factors required for the temperature compensation.

The circuit elements represented by the label VS1 which generate VCON and VCONB are illustrated in FIGS. 3 and 4. The oscillator 10 is coupled to a temperature sensor 36 that is adjacent to the oscillator to sense its temperature. In an integrated circuit embodiment, both the sensor 36 and oscillator 10 are situated on the same silicon substrate. Sensor 36 is a transducer that generates the analog voltage VCON with a magnitude proportional to the difference between the actual temperature and a reference temperature, K(T−TREF). VCON is routed to the oscillator 10 and is also routed through a digitally controlled programmable gain amplifier 38 that multiplies the amplitude of VCON by a factor Kp, where Kp is a digital value generated by conventional microprocessor 40. The voltage output of amplifier 38 is then subtracted at a node 42 from VMID, an offset voltage also generated by the microprocessor 40 through a digital to analog converter (DAC) 44. The resultant voltage is routed from the node 42 through a microprocessor controlled two-position switch 46 to produce VCONB at the oscillator 10. Switch 46 may be moved from the illustrated position to the second position to make VCONB equal to VCON, for reasons to be described. Both VCON and VCONB are monitored by the microprocessor 40 through path 41, as indicated in the figure.

FIG. 4 illustrates the step (indicated by numerals) taken by the microprocessor 40 to determine the values of Kp and VMID such that the difference between VCON and VCONB varies with temperature to maintain a substantially constant period of signal oscillation. A linear, first order temperature compensation is possible by making the difference between VCON and VCONB dependent on the following equation:

$$VCON - VCONB = (1 + Kp)K(T - TREF) - VMID$$

which may be derived from FIG. 3 with the switch 46 in the position shown. As a first step, the oscillator is allowed to warm to a constant temperature and then Kp is set to a minimum value and VMID equal to a VMID-MIN is calculated for VCON=VCONB (48). The calculation is repeated to find VMID equal to a VMID-MAX, with Kp set to a maximum value (50). The microprocessor 40 then switches off the oscillator 10 from its power source for a sufficient time to generate a thermal transient upon the reapplication of power to the oscillator (52). During this thermal transient, the frequency changes as a function of temperature. At predetermined intervals, the microprocessor 40 sets Kp and VMID first to their minimum values and then to their maximum values to measure the frequency. FIG. 5A shows the result of this measurement. The frequency of the oscillator 10 declines over temperature with a minimum Kp and increases over temperature with a maximum Kp. As indicated by FIG. 5A, the rate of frequency change has been found to be substantially linear. For a given temperature range, then, a value for Kp can be calculated by interpolation that provides a zero change in frequency (54), as indicated in FIG. 5B. The value of VMID, as stated, is an offset and its value is now interpolated by the microprocessor 40 to maintain the nominal oscillator frequency (56).

This start-up procedure need only be performed once to calculate the minimum and maximum Kp and the minimum and maximum VMID. The microprocessor 40, however is programmed to generate thermal transients periodically to calculate a new Kp as the thermal environment of the oscillator changes.

For integrated circuit based oscillators, an increase in temperature tends to cause the frequency of an uncompensated oscillator to decrease. The third stage 15 responds to an increase in temperature by increasing the value of VCON relative to VCONB per the equation given above. This increase in VCON causes the current gain of Q1 to exceed Q3 as shown in FIG. 2B. The change in propagation delay within the oscillator 10 then compensates for the temperature-induced decrease in frequency. If, on the other hand, the temperature decreases, VCONB will rise relative to VCON as shown in FIG. 2C and the propagation delay provided by stages 12 and 14 of the oscillator 10 will fall.

Returning now to FIGS. 1 and 3, means are provided for generating oscillation signals with a predetermined phase independent of the oscillator phase before triggering. Such means in the present embodiment comprise an emitter-coupled pair of transistors Q7 and Q8 controlled by voltage source VS2. In the present embodiment, VS2 represents the output of a conventional trigger generating circuit 58 that is found in oscilloscopes and other test instrumentation. The source VS2 generates voltage signals labeled GINB and GIN that are applied respectively to the bases of the transistors Q7 and Q8, which are biased by a constant current source I1. A current source I2 provides a minimum current through the stages 12 and 14 to minimize the transition time to restart and to stabilize the oscillator phase. The magnitudes of I7 and I8, which are the collector currents of Q7 and Q8, are controlled by GINB and GIN. As the amplitude of GIN increases relative to GINB, more current is drawn through Q8 than Q7. The currents through stages 12 and 14 are diverted from stages 12 and 14 to Q8. This diversion causes the oscillator 10 to shut down, with VOUT held low and VOUTB held high. This phase is set and maintained independent of the signal phase before the oscillator shutdown. Upon a reversal in the amplitudes of GIN and GINB, the oscillator begins from this predetermined phase.

The predetermined phase is maintained during the presence of the trigger pulse from trigger generator 58. Upon the pulse's conclusion, the oscillator 10 generates oscillating signals from this restart phase. With a constant restarting phase for the oscillating signal, trigger jitter is minimized in sampling the input signal.

To damp oscillations across the microstrip elements T3 and T4, they are terminated at both ends by, respectively, resistors R1, R5 and R2, R6. This termination allows for a quick recovery once a new trigger pulse is received.

Having illustrated and described the principles of the invention in a preferred embodiment, it should be apparent to those skilled in the art that the invention can be modified in arrangement and detail without departing from such principles.

I claim all modifications coming within the spirit and scope of the following claims.

1. A temperature compensated oscillator comprising:
a first stage for changing the state of the oscillating signal;
a second stage connected in parallel with the first stage for changing the state of the oscillating signal, the second stage having a greater signal propagation delay than the first stage;
means for combining the signal outputs of the stages to produce the oscillating signal, the signal oscillation period being determined by the signal delay contributed by each stage to the oscillating signal;
means for feeding back the oscillating signal to the inputs of the stages; and
means for changing the signal delay contributed by each stage to the oscillating signal to maintain a substantially constant oscillation period in response to a temperature change, including means for changing the gain of each stage for amplifying the oscillating signal, the combination of the amplified signal outputs determining the oscillation period.

2. The oscillator of claim 1 wherein the means for changing the signal delay contributed by each stage comprises:
means adjacent to the oscillator for sensing its temperature and generating in response a temperature-dependent signal; and
means responsive to the value of the temperature-dependent signal for producing a separate gain in each stage.

3. The oscillator of claim 2 wherein the means for producing a separate gain in each stage comprises:
means for multiplying the temperature dependent signal by a coefficient; and
means for calculating the coefficient value so that the multiplied temperature-dependent signal produces a separate gain in each stage which compensates for a change in the oscillator frequency caused by a change in temperature.

4. The oscillator of claim 1 wherein the first stage comprises an active circuit element and the second stage comprises a matching active circuit element with an additional delay element to provide the greater propagation delay.

5. The oscillator of claim 4 wherein each active circuit element comprises a differential amplifier.

6. The oscillator of claim 1 including a passive delay element coupled in the feedback means between the outputs and inputs of the stages for delaying the oscillating signal, the propagation delay of the passive delay element being greater than the propagation delay of the stages.

7. The oscillator of claim 1 further comprising:
means response to a trigger pulse for forcing the oscillator to set and maintain the oscillating signal in a predetermined phase during the presence of the trigger pulse,
the oscillator thereafter generating oscillations from the predetermined signal phase upon conclusion of the trigger pulse.

8. A method of compensating for temperature effects on an oscillator, comprising:
generating a signal whose magnitude is proportional to the temperature of the oscillator;
multiplying the signal by a coefficient with a first value such that the product, when applied to the oscillator, causes the frequency of the oscillator to decrease as its temperature increases;
multiplying the signal by a coefficient with a second value such that the product, when applied to the oscillator, causes the frequency of the oscillator to increase as its temperature increases;
determining from the first and second values of the coefficients a third value of a coefficient such that the product, when applied to the oscillator, causes the frequency of the oscillator to be substantially constant as the temperature of the oscillator increases and decreases.

* * * * *